US007270932B2

(12) United States Patent
Barr et al.

(10) Patent No.: US 7,270,932 B2
(45) Date of Patent: Sep. 18, 2007

(54) IMAGING COMPOSITION AND METHOD

(75) Inventors: Robert K. Barr, Shrewsbury, MA (US); James T. Fahey, Mendon, MA (US); Corey O'Connor, Worcester, MA (US); James G. Shelnut, Northboro, MA (US); John J. Piskorski, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 10/773,990

(22) Filed: Feb. 6, 2004

(65) Prior Publication Data

US 2005/0175929 A1 Aug. 11, 2005

(51) Int. Cl.
*G03C 1/73* (2006.01)
*G03C 1/00* (2006.01)
*G03F 7/029* (2006.01)
*G03F 7/031* (2006.01)
*G03F 7/20* (2006.01)

(52) U.S. Cl. .................. 430/270.1; 430/926; 430/332; 430/336; 430/340; 430/346; 430/356; 430/357; 430/358; 430/359; 430/363; 430/367; 430/541; 430/374; 430/962; 430/338

(58) Field of Classification Search ............ 430/270.1, 430/926

See application file for complete search history.

(56) References Cited

U.S. PATENT DOCUMENTS

| | | | | |
|---|---|---|---|---|
| 3,390,997 | A | 7/1968 | Read | 430/332 |
| 3,445,234 | A | 5/1969 | Cescon et al. | 430/332 |
| 3,598,592 | A | 8/1971 | Cescon | 430/340 |
| 3,630,736 | A | 12/1971 | Cescon et al. | 430/343 |
| 3,652,275 | A | 3/1972 | Martin et al. | 430/269 |
| 3,658,543 | A | 4/1972 | Gerlach, Jr. et al. | 430/343 |
| 3,666,466 | A | 5/1972 | Strilko | 430/333 |
| 3,761,942 | A | 9/1973 | Lorenz et al. | 430/374 |
| 3,977,953 | A | 8/1976 | Von Hirsch et al. | 204/157.9 |
| 3,993,489 | A | 11/1976 | Heimsch et al. | 430/14 |
| 4,065,315 | A | 12/1977 | Yamazaki et al. | 430/269 |
| 4,090,877 | A | 5/1978 | Streeper | 430/337 |
| 4,155,892 | A | 5/1979 | Emmons et al. | 524/507 |
| 4,162,162 | A | 7/1979 | Dueber | 430/288.1 |
| 4,280,888 | A | 7/1981 | Bush et al. | 522/81 |
| 4,341,860 | A | 7/1982 | Sysak | 430/277.1 |
| 4,343,885 | A | 8/1982 | Reardon, Jr. | 430/270.1 |
| 4,535,052 | A | 8/1985 | Anderson et al. | 430/277.1 |
| 4,565,769 | A | 1/1986 | Dueber et al. | 430/281.1 |
| 4,575,625 | A | 3/1986 | Knowles | 235/462.3 |
| 4,874,799 | A | 10/1989 | Hung et al. | 522/96 |
| 4,882,265 | A | 11/1989 | Laganis et al. | 430/522 |
| 4,894,314 | A | 1/1990 | Barr et al. | 430/281.1 |
| 4,917,977 | A | 4/1990 | Smothers | 430/1 |
| 4,987,230 | A | 1/1991 | Monroe | 546/94 |
| 5,019,549 | A | 5/1991 | Kellogg et al. | 503/227 |
| 5,102,952 | A | 4/1992 | Memon | 525/67 |
| 5,112,721 | A * | 5/1992 | Kuchta | 430/281.1 |
| 5,137,571 | A | 8/1992 | Eisenhart et al. | 106/162.8 |
| 5,139,928 | A | 8/1992 | Lewis et al. | 430/346 |
| 5,147,758 | A | 9/1992 | Smothers et al. | 430/281.1 |
| 5,149,617 | A | 9/1992 | Liu et al. | 430/346 |
| 5,153,106 | A | 10/1992 | Liu et al. | 430/340 |
| 5,204,467 | A | 4/1993 | Smothers | 546/94 |
| 5,219,917 | A | 6/1993 | Ingle et al. | 524/516 |
| 5,236,808 | A | 8/1993 | Smothers | 430/281.1 |
| 5,244,769 | A | 9/1993 | Yanagihara et al. | 430/138 |
| 5,256,520 | A | 10/1993 | Smothers | 430/281.1 |
| 5,302,429 | A | 4/1994 | Memon | 428/35.7 |
| 5,320,933 | A | 6/1994 | Lundy et al. | 430/283.1 |
| 5,389,489 | A | 2/1995 | Yanagihara et al. | 430/138 |
| 5,395,718 | A | 3/1995 | Jensen et al. | 430/5 |
| 5,413,629 | A | 5/1995 | Yasui et al. | 106/31.15 |
| 5,414,041 | A | 5/1995 | Larson et al. | 524/589 |
| 5,484,927 | A | 1/1996 | Smothers | 546/126 |
| 5,552,249 | A | 9/1996 | Jensen et al. | 430/5 |
| 5,665,522 | A | 9/1997 | Vogel et al. | 430/278.1 |
| 5,705,298 | A | 1/1998 | Knoedl, Jr. | 430/2 |
| 5,705,560 | A | 1/1998 | Takarabe et al. | 524/556 |
| 5,723,653 | A | 3/1998 | Santhanam | 560/19.6 |
| 5,742,385 | A | 4/1998 | Champa | 356/141.4 |
| 5,744,280 | A * | 4/1998 | Mooney et al. | 430/270.1 |
| 5,786,132 | A | 7/1998 | Nohr et al. | 430/343 |
| 5,821,497 | A | 10/1998 | Yamazaki et al. | 219/121.69 |
| 5,831,661 | A | 11/1998 | Tabuchi et al. | 347/262 |
| 5,837,429 | A | 11/1998 | Nohr et al. | 430/343 |
| 5,858,583 | A | 1/1999 | Dessauer et al. | 430/17 |
| 5,942,554 | A | 8/1999 | Ren et al. | 522/25 |
| 5,955,224 | A | 9/1999 | Caspar et al. | 430/17 |
| 6,187,432 | B1 | 2/2001 | Krish et al. | 428/343 |
| 6,251,571 | B1 | 6/2001 | Dessauer et al. | 430/343 |
| 6,309,797 | B1 | 10/2001 | Grinevich et al. | 430/293 |
| 6,322,950 | B1 | 11/2001 | Sorori et al. | 430/281.1 |

(Continued)

FOREIGN PATENT DOCUMENTS

| | | | |
|---|---|---|---|
| GB | 544 983 A | | 5/1942 |
| JP | 9-34110 | * | 2/1997 |
| JP | 11-109555 | | 4/1999 |

OTHER PUBLICATIONS

JPO English abstract for JP 9-34110 (Nakayama).*

(Continued)

*Primary Examiner*—Sin Lee
(74) *Attorney, Agent, or Firm*—John J. Piskorski

(57) ABSTRACT

Imaging compositions and methods of using the compositions are disclosed. The imaging compositions are sensitive to low levels of energy such that upon application of the low levels of energy the compositions change color or shade. The compositions may be used in methods of marking.

16 Claims, 1 Drawing Sheet
(1 of 1 Drawing Sheet(s) Filed in Color)

U.S. PATENT DOCUMENTS

| | | | | |
|---|---|---|---|---|
| 6,411,362 | B2 | 6/2002 | Anderson et al. | 355/50 |
| 6,433,035 | B1 | 8/2002 | Grinevich et al. | 522/2 |
| 6,433,069 | B1 | 8/2002 | Oeltjen et al. | 524/505 |
| 6,482,879 | B2 | 11/2002 | Hieltjes et al. | 524/398 |
| 6,492,019 | B1 | 12/2002 | Shipston et al. | 428/355 EN |
| 6,503,621 | B1 | 1/2003 | Ma et al. | 428/355 BL |
| 6,527,900 | B1 | 3/2003 | Kreckel et al. | 156/247 |
| 6,528,555 | B1 | 3/2003 | Nikutowski et al. | 523/116 |
| 6,541,109 | B1 | 4/2003 | Kumar et al. | 428/352 |
| 6,545,084 | B2 | 4/2003 | Brown et al. | 524/556 |
| 6,547,397 | B1 | 4/2003 | Kaufman et al. | 353/28 |
| 6,613,381 | B1 | 9/2003 | Bredahl et al. | 427/207.1 |
| 6,627,309 | B2 | 9/2003 | Stebbings et al. | 428/352 |
| 6,632,522 | B1 | 10/2003 | Hyde et al. | 428/355 R |
| 6,660,374 | B2 | 12/2003 | Smetana et al. | 428/327 |
| 6,754,551 | B1 | 6/2004 | Zohar et al. | 700/121 |
| 6,828,525 | B1 | 12/2004 | Hayes et al. | 219/121.85 |
| 6,835,789 | B1 * | 12/2004 | Kneafsey et al. | 526/307.3 |
| 6,869,746 | B2 * | 3/2005 | Matsumoto et al. | 430/270.1 |
| 2002/0028404 | A1 * | 3/2002 | Nakamura | 430/270.1 |
| 2003/0108708 | A1 | 6/2003 | Anderson et al. | 428/64.4 |
| 2003/0149164 | A1 | 8/2003 | Minnee et al. | 524/556 |
| 2005/0058332 | A1 | 3/2005 | Kaufman et al. | 382/133 |

OTHER PUBLICATIONS

Enthone Imaging Technologies Update; Photoimageable Legend Inks: Selection Criteria; Jun. 2002/No. 12.

Basic Printed Circuit Board Manufacture; Electronics Industry Training/Workshop 23; May 2002; pp. 1-13.

Technical Data Sheet Scribe ELP112; Aqueous Developable Liquid Photoimageable Legend Paste; Web site: www.electrapolymers.com, pp. 1-5 (date not available).

MEGA Electronics; Screen Printing Instructions; Mega Electronics Ltd, England; Web site: http://www.megaelect.demon.co.uk/; pp. 1-6 (date not available).

Grant & Hackh's Chemical Dictionary; Fifth Edition; McGraw Hill Book Company; pp. 306 and 469.

European Search Report of corresponding European Application No. 05 25 0634 dated May 25, 2005.

Grant & Hackh's Chemical Dictionary; Fifth Edition (Feb. 1987); McGraw Hill Book Company; pp. 306 and 469.

* cited by examiner

IMAGING COMPOSITION AND METHOD

BACKGROUND OF THE INVENTION

The present invention is directed to an imaging composition and method. More specifically, the present invention is directed to an imaging composition and method where the imaging composition undergoes a color or shade change upon exposure to energy at low powers.

There are numerous compositions and methods employed in various industries to form images on substrates to mark the substrates. Such industries include the paper industry, packaging industry, paint industry, medical industry, dental industry, electronics industry, textile industry, aeronautical, marine and automotive industries, and the visual arts, to name a few. Imaging or marking typically is used to identify an article such as the name or logo of a manufacturer, a serial number or lot number, tissue types, or may be used for alignment purposes in the manufacture of semiconductor wafers, aeronautical ships, marine vessels and terrestrial vehicles.

Marking also is employed in proofing products, photoresists, soldermasks, printing plates and other photopolymer products. For example, U.S. Pat. No. 5,744,280 discloses photoimageable compositions allegedly capable of forming monochrome and multichrome images, which have contrast image properties. The photoimageable compositions include photooxidants, photosensitizers, photodeactivation compounds and deuterated leuco compounds. The leuco compounds are aminotriarylmethine compounds or related compounds in which the methane (central) carbon atom is deuterated to the extant of at least 60% with deuterium incorporation in place of the corresponding hydrido aminotriaryl-methine. The patent alleges that the deuterated leuco compounds provide for an increased contrast imaging as opposed to corresponding hydrido leuco compounds. Upon exposure of the photoimageable compositions to actinic radiation a phototropic response is elicited.

Marking of information on labels, placing logos on textiles, or stamping information such as company name, a part or serial number or other information such as a lot number or die location on semiconductor devices may be affected by direct printing. The printing may be carried out by pad printing or screen printing. Pad printing has an advantage in printing on a curved surface because of the elasticity of the pad but is disadvantageous in making a fine pattern with precision. Screen printing also meets with difficulty in obtaining a fine pattern with precision due to the limited mesh size of the screen. Besides the poor precision, since printing involves making a plate for every desired pattern or requires time for setting printing conditions, these methods are by no means suitable for uses demanding real time processing.

Hence, marking by printing has recently been replaced by ink jet marking. Although ink jet marking satisfies the demand for speed and real time processing, which are not possessed by many conventional printing systems, the ink to be used, which is jetted from nozzles under pressure, is strictly specified. Unless the specification is strictly met, the ink sometimes causes obstruction of nozzles, resulting in an increase of reject rate.

In order to overcome the problem, laser marking has lately been attracting attention as a high-speed and efficient marking method and is already put to practical use in some industries. Many laser marking techniques involve irradiating only necessary areas of substrates with laser light to denature or remove the irradiated area or irradiating a coated substrate with laser light to remove the irradiated coating layer thereby making a contrast between the irradiated area (marked area) and the non-irradiated area (background).

Using a laser to mark an article such as a semiconductor chip is a fast and economical means of marking. There are, however, certain disadvantages associated with state-of-the art laser marking techniques that burn the surface to achieve a desired mark. For example, a mark burned in a surface by a laser may only be visible at select angles of incidence to a light source. Further, oils or other contaminants deposited on the article surface subsequent to marking may blur or even obscure the laser mark. Additionally, because the laser actually burns the surface of the work piece, for bare die marking, the associated burning may damage any underlying structures or internal circuitry or by increasing internal die temperature beyond acceptable limits. Moreover, where the manufactured part is not produced of a laser reactive material, a laser reactive coating applied to the surface of a component adds expense and may take hours to cure.

Alternatively, laser projectors may be used to project images onto surfaces. They are used to assist in the positioning of work pieces on work surfaces. Some systems have been designed to project three-dimensional images onto contoured surfaces rather than flat surfaces. The projected images are used as patterns for manufacturing products and to scan an image of the desired location of a ply on previously placed plies. Examples of such uses are in the manufacturing of leather products, roof trusses, and airplane fuselages. Laser projectors are also used for locating templates or paint masks during the painting of aircraft.

The use of scanned laser images to provide an indication of where to place or align work piece parts, for drilling holes, for forming an outline for painting a logo or picture, or aligning segments of a marine vessel for gluing requires extreme accuracy in calibrating the position of the laser projector relative to the work surface. Typically six reference points are required for sufficient accuracy to align work piece parts. Reflectors or sensors are positioned in an approximate area where the ply is to be placed. Since the points are at fixed locations relative to the work and the laser, the laser also knows where it is relative to the work. Typically, workers hand mark the place where the laser beam image contacts the work piece with a marker or masking tape to define the laser image. Such methods are tedious, and the workers' hands may block the laser image disrupting the alignment beam to the work piece. Accordingly, misalignment may occur.

Another problem associated with laser marking is the potential for opthalmological damage to the workers. Many lasers used in marking may cause retinal damage to workers. Generally, lasers, which generate energy exceeding 5 mW, present hazards to workers.

Accordingly, there is a need for improved imaging compositions and methods of marking a work piece.

SUMMARY OF THE INVENTION

Imaging compositions include one or more sensitizers in sufficient amounts to affect a color or shade change in the compositions upon application of energy at powers of 5 mW or less.

In another embodiment the imaging compositions include one or more sensitizers in sufficient amounts to affect a color or shade change in the compositions upon application of energy at powers of 5 mW or less, and one or more adhesion promoters or an adhesive.

In a further embodiment the imaging compositions include one or more sensitizers in sufficient amounts to affect a color or shade change in the compositions upon exposure to energy at powers of 5 mW or less, and further including components to form a paint formulation.

In addition to one or more sensitizers, the imaging compositions may include one or more polymer binders, plasticizers, flow agents, chain transfer agents, organic acids, surfactants, thickeners, rheology modifiers, diluents and other optional components to tailor the compositions for a particular marking method and work piece. The compositions may then be applied to a work piece to form an image, which may be used to manufacture a product.

Methods of imaging include providing an imaging composition comprising one or more sensitizers in sufficient amounts to affect a color or shade change upon exposure of energy at powers of 5 mW or less, applying the imaging composition to a work piece; and applying energy at powers of 5 mW or less to the imaging composition to affect the color or shade change. Alternatively, energy may be applied selectively to form an imaged pattern on the work piece. The color or shade change may be used in the manufacture or repair of work pieces, to alter the initial color or shade of a work piece, or to vary the color or shade of a work piece upon exposure to suitable energy levels. The imaging compositions and methods provide a rapid and efficient means of changing the color or shade of a work piece or of placing an image on a work piece such as aeronautical ships, marine vessels and terrestrial vehicles, or for forming images on textiles.

Portions of the imaging compositions may be removed with a suitable developer or stripper before or after further processing is done on the work piece. Also, because the compositions may include one or more adhesion promoters or an adhesive, unwanted portions may be peeled from the work piece.

The image may be used as a mark or indicator, for example, to drill holes for fasteners to join parts together, to form an outline for making a logo or picture on an airplane, or to align segments of marine vessel parts. Since the compositions may be promptly applied to the work piece and the image promptly formed by application of energy at powers of 5 mW or less to create a color or shade contrast, workers no longer need to be adjacent the work piece to mark laser beam images with a hand-held marker or tape in the fabrication of articles. Accordingly, the problems of blocking light caused by the movement of workers hands and the slower and tedious process of applying marks by workers using a hand-held marker or tape is eliminated. Further, the low powers of energy, which are used to cause the color or shade change, eliminates or at least reduces the potential for opthalmological damage to workers.

The reduction of human error increases the accuracy of marking. This is important when the marks are used to direct the alignment of parts such as in aeronautical ships, marine vessels or terrestrial vehicles where accuracy in fabrication is critical to the reliable and safe operation of the machine.

The imaging compositions may be applied to the substrate by methods such as spray coating, brushing, roller coating, ink jetting, dipping or other suitable methods. Energy sources for applying a sufficient amount of energy to create the color or shade change include, but are not limited to laser, infrared and ultraviolet light generating apparatus. Conventional apparatus may be employed, thus new and specialized apparatus are not necessary to use the compositions and methods. Additionally, the single, non-selective coating application of the compositions on the work piece followed by prompt application of energy to create the color or shade change makes the compositions suitable for assembly line use. Accordingly, the compositions provide for more efficient manufacturing than many conventional alignment and imaging processes.

BRIEF DESCRIPTION OF THE DRAWINGS

The file of this patent contains at least one drawing executed in color. Copies of this patent with color drawing(s) will be provided by the Patent Office upon request and payment of the necessary fee.

DETAILED DESCRIPTION OF THE INVENTION

Figure 1:
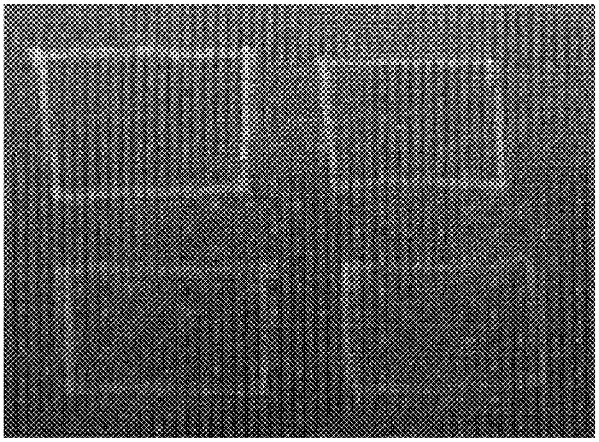
FIG. 1 is a photograph of a photofugitive response by an imaging composition dried on a polymer film after selective application of a laser beam.

As used throughout this specification, the following abbreviations have the following meaning, unless the context indicates otherwise: ° C.=degrees Centigarde; IR=infrared; UV=ultraviolet;. gm=gram; mg=milligram; L=liter; mL=milliliter; wt %=weight percent; erg=1 dyne cm=$10^{-7}$ joules; J=joule; mJ=millijoule; nm=nanometer=$10^{-9}$ meters; cm=centimeters; mm=millimeters; W=watt=1 joule/second; and mW=milliwatt; ns=nanosecond; μsec=microsecond; Hz=hertz; KV=kilivolt.

The terms "polymer" and "copolymer" are used interchangeably throughout this specification. "Actinic radiation" means radiation from light that produces a chemical change. "Photofugitive response" means that the application of energy causes a colored material to fade or become lighter. "Phototropic response" means that the application of energy causes material to darken. "Changing shade" means that the color fades, or becomes darker. "(Meth)acrylate" includes both methacrylate and acrylate, and "(meth)acrylic acid" includes both methacrylic acid and acrylic acid. "Diluent" means a carrier or vehicle, such as solvents or solid fillers.

Unless otherwise noted, all percentages are by weight and are based on dry weight or solvent free weight. All numerical ranges are inclusive and combinable in any order, except where it is logical that such numerical ranges are constrained to add up to 100%.

Imaging compositions include one or more sensitizers in sufficient amounts to affect a color or shade change upon exposure to energy at powers of 5 mW or less. The imaging compositions may be applied to a work piece followed by applying energy at powers of 5 mW or less to affect a color or shade change on the entire work piece, or to form an imaged pattern on the work piece. For example, an imaging composition may be applied selectively to a work piece followed by the application of energy to affect the color or shade change to produce an imaged pattern on the work piece. Alternatively, the imaging composition may cover the entire work piece and the energy applied selectively to affect the color or shade change to form an imaged pattern on the work piece.

The imaging compositions may be applied to a work piece by any suitable method as discussed below. The compositions may be removed by peeling the unwanted portions from a work piece or a suitable developer or stripper may be used. Such developers or strippers may be conventional aqueous base or organic developers and strippers.

Sensitizers employed in the compositions are compounds, which are activated by energy to change color or shade, or upon activation cause one or more other compounds to change color or shade. The imaging compositions include one or more photosensitizers sensitive to visible light and may be activated with energy at powers of 5 mW or less. Generally, such sensitizers are included in amounts of from 0.005 wt % to 10 wt %, or such as from 0.05 wt % to 5 wt %, or such as from 0.1 wt % to 1 wt % of the imaging composition.

Sensitizers, which are activated in the visible range, typically are activated at wavelengths of from above 300 nm to less than 600 nm, or such as from 350 nm to 550 nm, or such as from 400 nm to 535 nm. Such sensitizers include, but are not limited to cyclopentanone based conjugated compounds such as cyclopentanone, 2,5-bis-[4-(diethylamino)phenyl]methylene]-, cyclopentanone, 2,5-bis[(2,3,6,7-tetrahydro-1H,5H-benzo[ij]quinolizin-9-yl)xmethylene]-, and cyclopentanone, 2,5-bis-[4-(diethyl-amino)-2-methylphenyl] methylene]-. Such cyclopentanones may be prepared from cyclic ketones and tricyclic aminoaldehydes by methods known in the art.

Examples of such suitable conjugated cyclopentanones have the following formula:

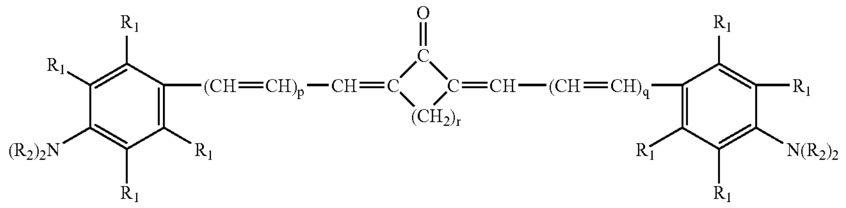

(I)

where p and q independently are 0 or 1, r is 2 or 3; and R1 is independently hydrogen, linear or branched (C1-C10) aliphatic, or linear or branched (C1-C10)alkoxy, typically R1 is independently hydrogen, methyl or methoxy; R2 is independently hydrogen, linear or branched (C1-C10)aliphatic, (C5-C7)ring, such as an alicyclic ring, alkaryl, phenyl, linear or branched (C1-C10)hydroxyalkyl, linear or branched hydroxy terminated ether, such as —(CH2)v-O-(CHR3)w-OH, where v is an integer of from 2 to 4, w is an integer of from 1 to 4, and R3 is hydrogen or methyl and carbons of each R2 may be taken together to form a 5 to 7 membered ring with the nitrogen, or a 5 to 7 membered ring with the nitrogen and with another heteroatom chosen from oxygen, sulfur, and a second nitrogen. Such sensitizers may be activated at powers of 5 mW or less.

Other sensitizers which are activated in the visible light range include, but are not limited to N-alkylamino aryl ketones such as bis(9-julolidyl ketone), bis-(N-ethyl-1,2,3,4-tetrahydro-6-quinolyl)ketone and p-methoxyphenyl-(N-ethyl-1,2,3,4-tetrahydro-6-quinolyl)ketone; visible light absorbing dyes prepared by base catalyzed condensation of an aldehyde or dimethinehemicyanine with the corresponding ketone; visible light absorbing squarylium compounds; 1,3-dihydro-1-oxo-2H-indene derivatives; coumarin based dyes such as ketocoumarin, and 3,3'-carbonyl bis(7-diethylaminocoumarin); halogenated titanocene compounds such as bis(eta.5-2,4-cyclopentadien-1-yl)-bis(2,6-difluro-3-(1H-pyrrol-1-yl)-phenyl) titanium; and compounds derived from aryl ketones and p-dialkylaminoarylaldehydes. Examples of additional sensitizers include fluorescein type dyes and light absorber materials based on the triarylmethane nucleus. Such compounds include Eosin, Eosin B, and Rose Bengal. Another suitable compound is Erythrosin B. Methods of making such sensitizers are known in the art, and many are commercially available. Typically, such visible light activated sensitizers are used in amounts of from 0.05 wt % to 2 wt %, or such as from 0.25 wt % to 1 wt %, or such as from 0.1 wt % to 0.5 wt % of the composition.

Optionally, the imaging compositions may include one or more photosensitizers that are activated by UV light. Such sensitizers which are activated by UV light are typically activated at wavelengths of from above 10 nm to less than 300 nm, or such as from 50 nm to 250 nm, or such as from 100 nm to 200 nm. Such UV activated sensitizers include, but are not limited to, polymeric sensitizers having a weight average molecular weight of from 10,000 to 300,000 such as polymers of 1-[4-(dimethylamino)phenyl]-1-(4-methoxyphenyl)-methanone, 1-[4-(dimethylamino)phenyl]-1-(4-hydroxyphenyl)-methanone and 1-[4-(dimethylamino)phenyl]-1-[4-(2-hydroxyethoxy)-phenyl]-methanone; free bases of ketone imine dyestuffs; amino derivatives of triarylmethane dyestuffs; amino derivatives of xanthene dyestuffs; amino derivatives of acridine dyestuffs; methine dyestuffs; and polymethine dyestuffs. Methods of preparing such compounds are known in the art. Typically, such UV activated sensitizers are used in amounts of from 0.05 wt % to 1 wt %, or such as from 0.1 wt % to 0.5 wt % of the composition.

Optionally, the imaging compositions may include one or more photosensitizers that are activated by IR light. Such sensitizers which are activated by IR light are typically activated at wavelengths of from greater than 600 nm to less than 1,000 nm, or such as from 700 nm to 900 nm, or such as from 750 nm to 850 nm. Such IR activated sensitizers include, but are not limited to infrared squarylium dyes, and carbocyanine dyes. Such dyes are known in the art and may be made by methods described in the literature. Typically, such dyes are included in the compositions in amounts of from 0.05 wt % to 3 wt %, or such as from 0.5 wt % to 2 wt %, or such as from 0.1 wt % to 1 wt % of the composition.

Reducing agents also may be used in the imaging compositions. Compounds which may function as reducing agents include, but are not limited to, one or more quinone compounds such as pyrenequinones such as 1,6-pyrenequinone and 1,8-pyrenequinone; 9,10-anthrquinone, 1-chloroanthraquinone, 2-chloro-anthraquinone, 2-methylanthrquinone, 2-ethyl anthraquinone, 2-tert-butylanthraquinone, octamethylanthraquinone, 1,4-naphthoquinone, 9,10-phenanthrenequinone, 1,2-benzaanthrquinone, 2,3-benzanthraquinone, 2-methyl-1,4-naphthoquinone, 2,3-dichloronaphthoquinone, 1,4-dimethylanthraquinone, 2,3-dimethylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione.

Other compounds which may function as reducing agents include, but are not limited to, acyl esters of triethanolamines having a formula:

$$N(CH_2CH_2OC(O)—R)_3 \quad (II)$$

where R is alkyl of 1 to 4 carbon atoms, and 0 to 99% of a $C_1$ to $C_4$ alkyl ester of nitrilotriacetic acid or of 3,3',3"-nitrilotripropionic acid. Examples of such acyl esters of triethanolamine are triethanolamine triacetate and dibenzylethanolamine acetate.

One or more reducing agents may be used in the imaging compositions to provide the desired color or shade change. Typically, one or more quinones are used with one or more acyl ester of triethanolamine to provide the desired reducing agent function. Reducing agents may be used in the, compositions in amounts of from 0.05 wt % to 50 wt % or such as from 5 wt % to 40 wt %, or such as 20wt % to 35 wt %.

Suitable color formers include, but are not limited to, leuco-type compounds. Such leuco-type compounds include, but are not limited to, aminotriarylmethanes, aminoxanthenes, aminothioxanthenes, amino-9,10-dihydroacridines, aminophenoxazines, aminophenothiazines, aminodihydrophenazines, antinodiphenylmethines, leuco indamines, aminohydrocinnamic acids such as cyanoethanes and leuco methines, hydrazines, leuco indigoid dyes, amino-2,3-dihydroanthraquinones,tetrahalo-p,p'-biphenols, 2(p-hydroxyphenyl)-4,5-diphenylimidazoles, and phenethylanilines. Such compounds are included in amounts of from 0.1 wt % to 5 wt %, or such as from 0.25 wt % to 3 wt %, or such as from 0.5 wt % to 2 wt % of the composition.

Oxidizing agents also may be included in the imaging compositions to influence the color or shade change. Typically such oxidizing agents are used in combination with one or more color former. Compounds, which may function as oxidizing agents include, but are not limited to, hexaarylbiimidazole compounds such as 2,4,5,2',4',5'-hexaphenylbiimidazole, 2,2',5-tris(2-chlorophenyl)-4-(3,4-dimethoxyphenyl)-4,5-diphenylbiimidazole (and isomers), 2,2'-bis(2-ethoxyphenyl)-4,4',5,5',-tetraphenyl-1,1'-bi-1H-mimidazole, and 2,2'-di-1-naphthalenyl-4,4',5,5'-tetraphenyl-1'-bi-1H-imidazole. Other suitable compounds include, but are not limited to, halogenated compounds with a bond dissociation energy to produce a first halogen as a free radical of not less than 40 kilocalories per mole, and having not more than one hydrogen attached thereto; a sulfonyl halide having a formula: R'—$SO_2$—X where R' is an alkyl, alkenyl, cycloalkyl, aryl, alkaryl, or aralkyl and X is chlorine or bromine; a sulfenyl halide of the formula: R"—S—X' where R" and X' have the same meaning as R' and X above; tetraaryl hydrazines, benzothiazolyl disulfides, polymnetharylaldehydes, alkylidene 2,5-cyclohexadien-1-ones, azobenzyls, nitrosos, alkyl(T1), peroxides, and haloamines. Such compounds are included in the compositions in amounts of from 0.25 wt % to 10 wt %, or such as from 0.5 wt % to 5 wt %, or such as from 1 wt % to 3 wt % of the composition. Methods are known in the art for preparing the compounds and many are commercially available.

Film forming polymers may be included in the imaging compositions to function as binders for the compositions. Any film forming binder may be employed in the formulation of the compositions provided that the film forming polymers do not adversely interfere with the desired color or shade change. The film forming polymers are included in amounts of from 10 wt % to 90 wt %, or such as from 15 wt % to 70 wt %, or such as from 25 wt % to 60 wt % of the compositions. Typically, the film forming polymers are derived from a mixture of acid functional monomers and non-acid functional monomers. The acid and non-acid functional monomers are combined to form copolymers such that the acid number ranges from at least 80, or such as from 150 to 250. Examples of suitable acid functional monomers include (meth)acrylic acid, maleic acid, fumaric acid, citraconic acid, 2-acrylamido-2-methylpropanesulfonic acid, 2-hydroxyethyl acrylol phosphate, 2-hydroxypropyl acrylol phosphate, and 2-hydroxy-alpha-acrylol phosphate.

Examples of suitable non-acid functional monomers include esters of (meth)acrylic acid such as methyl acrylate, 2-ethyl hexyl acrylate, n-butyl acrylate, n-hexyl acrylate, methyl methacrylate, hydroxyl ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethyylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2,2-di(p-hydroxyphenyl)-propane dimethacrylate, triethylene glycol dimethacrylate, polyoxypropyltrimethylol propane triacrylate, ethylene glycol dimethacrylate, butylenes glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate; styrene and substituted styrene such as 2-methyl styrene and vinyl toluene and vinyl esters such as vinyl acrylate and vinyl methacrylate.

Other suitable polymers include, but are not limited to, nonionic polymers such as polyvinyl alcohol, polyvinyl pyrrolidone, hydroxyl-ethylcellulose, and hydroxyethylpropyl. methylcellulose.

Chain transfer agents may be used in the imaging compositions. Such chain transfer agents function as accelerators. One or more chain transfer agents may be used in the imaging compositions. Chain transfer agents or accelerators increase the rate at which the color or shade change occurs after exposure of energy. Any compound which accelerates the rate of color or shade change may be used. Accelerators may be included in the compositions in amounts of from 0.01 wt % to 25 wt %, or such as from 0.5 wt % to 10 wt %. Examples of suitable accelerators include onium salts, and amines.

Suitable onium salts include, but are not limited to, onium salts in which the onium cation is iodonium or sulfonium such as onium salts of arylsulfonyloxybenzenesulfonate anions, phosphonium, oxysulfoxonium, oxysulfonium, sulfoxonium, ammonium, diazonium, selononium, arsonium, and N-substituted N-heterocyclic onium in which N is substituted with a substituted or unsubstituted saturated or unsaturated alkyl or aryl group.

The anion of the onium salts may be, for example, chloride, or a non-nucleophilic anion such as tetrafluoroborate, hexafluorophosphate, hexafluoroarsenate, hexafluoroantimonate, triflate, tetrakis-(pentafluorophosphate) borate, pentafluoroethyl sulfonate, p-methyl-benzyl sulfonate, ethylsulfonate, trifluoromethyl acetate and pentafluoroethyl acetate.

Examples of typical onium salts include, for example, diphenyl iodonium chloride, diphenyliodonium hexafluorophosphate, diphenyl iodonium hexafluoroantimonate, 4,4'-dicumyliodonium chloride, dicumyliodonium hexafluorophosphate, N-methoxy-a-picolinium-p-toluene sulfonate, 4-methoxybenzene-diazonium tetrafluoroborate, 4,4'-bis-dodecylphenyliodonium-hexafluoro phosphate, 2-cyanoethyl-triphenylphosphonium chloride, bis-[4-diphenylsulfonionphenyl]sulfide-bis-hexafluoro phosphate, bis-4-dodecylphenyliodonium hexafluoroantimonate and triphenylsulfonium hexafluoroantimonate.

Suitable amines include, but are not limited to primary, secondary and tertiary amines such as methylamine, diethylamine, triethylamine, heterocyclic amines such as pyridine and piperidine, aromatic amines such as aniline, quaternary ammonium halides such as tetraethylammonium fluoride, and quaternary ammonium hydroxides such as tetraethylammonium hydroxide. The triethanolamines of formula II also have accelerator activity.

Plasticizers also may be included in the compositions. Any suitable plasticizer may be employed. Plasticizers may be included in amounts of from 0.5 wt % to 15 wt %, or such as from 1 wt % to 10 wt % of the compositions. Examples of suitable plasticizers include phthalate esters such as dibutylphthalate, diheptylphthalate, dioctylphthalate and diallylphthalate, glycols such as polyethylene glycol and polypropylene glycol, glycol esters such as triethylene glycol diacetate, tetraethylene glycol diacetate, and dipropylene glycol dibenzoate, phosphate esters such as tricresylphosphate, triphenylphosphate, amides such as p-toluenesulfoneamide, benzenesulfoneamide, N-n-butylacetoneamide, aliphatic dibasic acid esters such as diisobutyladipate, dioctyladipate, dimethylsebacate, dioctylazelate, dibutylmalate triethylcitrate, tri-n-butylacetylcitrate, butyl-laurate, dioctyl-4,5-diepoxycyclohexane-1,2-dicarboxylate, and glycerine triacetylesters.

One or more flow agents also may be included in the compositions. Flow agents are compounds, which provide a smooth and even coating over a substrate. Flow agents may be included in amounts of from 0.05 wt % to 5 wt % or such as from 0.1 wt % to 2 wt % of the compositions. Suitable flow agents include, but are not limited to, copolymers of alkylacrylates. An example of such alkylacrylates is a copolymer of ethyl acrylate and 2-ethylhexyl acrylate.

Optionally, one or more organic acids may be employed in the imaging compositions. Organic acids may be used in amounts of from 0.01 wt % to 5 wt %, or such as from 0.5 wt % to 2 wt %. Examples of suitable organic acids include formic acid, acetic acid, propionic acid, butyric acid, valeric acid, caproic acid, caprylic acid, capric acid, lauric acid, phenylacetic acid, benzoic acid, phthalic acid, isophthalic acid, terephthalic acid, adipic acid, 2-ethylhexanoic acid, isobutyric acid, 2-methylbutyric acid, 2-propylheptanoic acid, 2-phenylpropionic acid, 2-(p-isobutylphenyl)propionic acid, and 2-(6-methoxy-2-naphthyl)propionic acid.

Optionally, one or more surfactants may be used in the imaging compositions. Surfactants may be included in the compositions in amounts of from 0.5 wt % to 10 wt %, or such as from 1 wt % to 5 wt % of the composition. Suitable surfactants include non-ionic, ionic and amphoteric surfactants. Examples of suitable non-ionic surfactants include polyethylene oxide ethers, derivatives of polyethylene oxides, aromatic ethoxylates, acetylenic ethylene oxides and block copolymers of ethylene oxide and propylene oxide. Examples of suitable ionic surfactants include alkali metal, alkaline earth metal, ammonium, and alkanol ammonium salts of alkyl sulfates, alkyl ethoxy sulfates, and alkyl benzene sulfonates. Examples of suitable amphoteric surfactants include derivatives of aliphatic secondary and tertiary amines in which the aliphatic radical may be straight chain or branched and where one or the aliphatic substituents conatins from 8 to 18 carbon atoms and one contains an anionic water solubilizing group such as carboxy, sulfo, sulfato, phosphate, or phosphono. Specific examples of such amphoteric surfactants are sodium 3-dodecylaminopropionate and sodium 3-dodecylaminopropane sulfonate.

Thickeners may be included in the imaging compositions in conventional amounts. Any suitable thickener may be incorporated in the imaging compositions. Typically, thickeners range from 0.05 wt % to 10 wt %, or such as from 1 wt % to 5 wt % of the compositions. Conventional thickeners may be employed. Examples of suitable thickeners include low molecular weight polyurethanes such as having at least three hydrophobic groups interconnected by hydrophilic polyether groups. The molecular weight of such thickeners ranges from 10,000 to 200,000. Other suitable thickeners include hydrophobically modified alkali soluble emulsions, hydrophobically modified hydroxyethyl cellulose and hydrophobically modified polyacrylamides.

Rheology modifiers may be included in conventional amounts. Typically rheology modifiers are used in amounts of from 0.5 wt % to 20 wt %, or such as from 5 wt % to 15 wt % of the compositions. Examples of rheology modifiers include vinyl aromatic polymers and acrylic polymers.

Diluents may be included in the imaging compositions to provide a vehicle or carrier for the other components. Diluents are added as needed. Solid diluents or fillers are typically added in amounts to bring the dry weight of the compositions to 100 wt %. Examples of solid diluents are celluloses. Liquid diluents or solvents are employed to make solutions, suspensions, dispersions or emulsions of the active components of the compositions. The solvents may be aqueous or organic, or mixtures thereof. Examples of organic solvents include alcohols such as methyl, ethyl and isopropyl alcohol, diisopropyl ether, diethylene glycol dimethyl ether, 1,4-dioxane, terahydrofuran or 1,2-dimethoxy propane, and ester such as butyrolactone, ethylene glycol carbonate and propylene glycol carbonate, an ether ester such as methoxyethyl acetate, ethoxyethyl acetate, 1-methoxypropyl-2-acetate, 2-methoxypropyl-1-acetate, 1-ethoxypropyl-2-acetate and 2-ethoxypropyl-1-acetate, ketones such as acetone and methylethyl ketone, nitriles such as acetonitrile, propionitrile and methoxypropionitrile, sulfones such as sulfolan, dimethylsulfone and diethylsulfone, and phosphoric acid esters such as trimethyl phosphate and triethyl phosphate.

The imaging compositions may be in the form of a concentrate. In such concentrates, the solids content may range from 80 wt % to 98 wt %, or such as from 85 wt % to 95 wt %. Concentrates may be diluted with water, one or more organic solvents, or a mixture of water and one or more organic solvents. Concentrates may be diluted such that the solids content ranges from 5 wt % to less than 80 wt %, or such as from 10 wt % to 70 wt %, or such as from 20 wt % to 60 wt %.

One or more adhesion promoters may be included in the imaging compositions to improve cohesion between the imaging compositions and the work pieces. Any suitable adhesion promoter may be used. Such adhesion promoters may be included in amounts of from 0.5 wt % to 10 wt % or such as from 1 wt % to 5 wt % of the compositions.

Examples of such adhesion promoters include acrylamido hydroxyl acetic acid (hydrated and anhydrous), bisacrylamido acetic acid, 3-acrylamido-3-methyl-butanoic acid, and mixtures thereof.

Alternatively, adhesives may be mixed with the imaging compositions to enable firm adherence of the compositions to a work piece. An example of a suitable adhesive is a releasable adhesive. Any releasable adhesive may be used in the imaging compositions provided that it does not adversely interfere with the desired color or shade change. Releasable adhesives permit removal of the compositions by peeling them from a substrate as well as removal with an appropriate developer or stripper. Releasable adhesives are included in amounts of from 0.05 wt % to 10 wt %, or such as from 0.1 wt % to 5 wt %, or such as from 1 wt % to 3 wt % of the composition. Suitable releasable adhesives include, but are not limited to, pressure sensitive adhesives. Examples of such adhesives include acrylics, polyurethanes, poly-alpha-olefins, silicones, combinations of acrylate pressure sensitive adhesives and thermoplastic elastomer-based pressure sensitive adhesives, and tackified natural and synthetic rubbers.

Acrylate pressure sensitive adhesives in combination with thermoplastic elastomer-based pressure sensitive adhesives include from 10 wt % to 90 wt % or such as from 30 wt % to 70 wt % of the acrylates pressure sensitive adhesive, and 10 wt % to 90 wt % or such as from 30 wt % to 70 wt % of the elastomer-based pressure sensitive adhesive. An example of a suitable acrylate pressure sensitive adhesive is derived from at, least one polymerized monofunctional (meth)acrylic acid ester whose polymer has a $T_g$ (glass transition temperature) of no greater than 0° C., and optionally, at least one copolymerized monofunctional ethylenically unsaturated monomer whose homopolymer has a $T_g$ of at least 10° C. The monofunctional ethylenically unsaturated monomer may be present in the acrylate fraction of the adhesive in amounts of from 5 wt % to 10 wt %. The thermoplastic elastomer-based pressure sensitive adhesive component may be composed of radial block copolymers such as block copolymers of polystyrene with polybutadiene, or polyisoprene or mixtures thereof. Optionally, cross-linking agents may be included.

The releasable adhesive components may be blended with the photosensitive components and any other optional additives included on the composition. Conventional methods may be used to blend the various components. The compositions may be applied to a substrate such as by spray coating, brushing, dipping, roller coating or laminating. Any solvent or residual solvent may be driven off by air drying or by applying a sufficient amount of heat from a hot-air dryer to form cohesion between the composition and the work piece.

When the imaging compositions are used in paints, such paints include components such as thickeners, rheology modifiers, diluents and other optional components typically found in paint formulations.

The components, which compose the imaging compositions, may be combined by any suitable method known in the art. The components may be blended or mixed together using conventional apparatus to form a solid mixture, concentrate, solution, suspension, dispersion or emulsion. The formulation process is typically performed in light controlled environments to prevent premature activation of one or more of the components. The compositions may then be stored for later application or applied promptly after formulation to a substrate by anyone of the methods discussed above. Typically the compositions are stored in light controlled environments prior to use. For example, compositions with sensitizers activated by visible light are typically formulated and stored under red light.

Upon application of a sufficient amount of energy to an imaging composition, a photo fugitive or a phototropic response occurs. The amount of energy may be from 0.2 $mJ/cm^2$ and greater, or such as from 0.2 $mJ/cm^2$ to 100 $mJ/cm^2$, or such as from 2 $mJ/cm^2$ to 40 $mJ/cm^2$, or such as from 5 $mJ/cm^2$ to 30 $mJ/cm^2$.

The imaging compositions undergo color or shade changes with the application of powers of 5 mW of energy or less (i.e., greater than 0 mW), or such as from less than 5 mW to 0.01 mW, or such as from 4 mW to 0.05 mW, or such as from 3mW to 0.1 mW, or such as from 2 mW to 0.25 mW or such as from 1 mW to 0.5 mW. Typically, such powers are generated with light sources in the visible range. Other photosensitizers and energy sensitive components, which may be included in the imaging compositions, may elicit a color or shade change upon exposure to energy from light outside the visible range. Such photosensitizers and energy sensitive compounds are included to provide a more pronounced color or shade contrast with that of the response caused by the application of 5 mW or less. Typically photosensitizers and energy sensitive compounds, which form the color or shade contrast with photosensitizers activated by energy at powers of 5 mW or less, elicit a phototropic response.

While not being bound by theory, one or more color or shade changing mechanisms are believed involved to provide a color or shade change after energy is applied. For example, when a photofugitive response is induced, the one or more sensitizers releases a free radical to activate the one or more reducing agents to reduce the one or more sensitizers to affect the color or shade change in the composition. When a phototropic response is induced, for example, free radicals from one or more sensitizer induces a redox reaction between one or more leuco-type compound and one or more oxidizing agent to affect the color or shade change. Some formulations have combinations of photofugitive and phototropic responses. For example, exposing a composition to artificial energy, i.e., laser light, generates a free radical from one or more sensitizers which then activates one or more reducing agents to reduce the sensitizer to cause a photofugitive response, and then exposing the same composition to ambient light to cause one or more oxidizing agents to oxidize one or more leuco-type compounds.

Any suitable energy source may be used to induce the photofugitive or phototropic response. Examples of suitable energy sources include, but are not limited to, lasers, including lasers generated from hand held lasers and 3-D imaging systems, and flash lamps. Operating wavelengths of lasers may range from IR through UV. Two classes of lasers are described which are suitable for inducing a color or shade change.

Excimer lasers are high power lasers that can generate high fluence light in the UV frequency range. Their lasing capacity is based upon the excitation of specific diatomic gas molecules. In particular, excimer lasers constitute a family of laser, which emit light in the wavelength range of 157 nm to 355 nm. The most common excimer wavelengths and respective diatomic gases are XeCl (308) nm), KrF (248 nm) and ArF (193 nm). The lasting action within an excimer is the result of a population inversion in the excited dimmers formed by the diatomic gases. Pulse widths are in the 10 ns to 100 ns resulting in high energy, short pulse width pulses.

Solid state lasers are high power lasers that can generate concentrated light beams from the IR through the UV wavelength ranges. A selected portion of these solid state lasers is based on materials and involve the doping of neodymium into a solid host such as yttrium-aluminum garnet (YAG), yttrium-lithium-fluoride (YLF), and yttrium vanadate ($YVO_5$). Such materials lase at a fundamental wavelength in the IR range of 1.04 to 1.08 microns. The lasing may be extended to shorter wavelengths through the use of nonlinear optical crystals such as lithium triborate (LBO) or potassium titanyl phosphate (KTP). As an example, the fundamental 1.06 microns radiation from a neodymium doped YAG laser may be frequency increased to a wavelength of 532 nm using such crystals.

An example of an alternative light source to the excimer laser is a short pulse linear excimer, UV flash lamp. Such lamps include a transparent quart lamp tube with a wall thickness of 1 mm with an internal bore of 3 to 20 mm in diameter. Such flash lamps may be as long as 30 cm. Electrodes made of tungsten are sealed into the ends of the lamp tube, which is filled with a noble gas such as xenon. The flash lamp is pulsed in the range of 1 Hz to 20 Hz by applying a high voltage in the range of 5 KV to 40 KV to the electrodes using a capacitor bank. The charge ionizes the xenon atoms to form a plasma which emits a broadband of radiation ranging in wavelengths of from 200 nm to 800 nm. The flash lamp may include a reflector placed partially around the tube to shape and guide the radiation from the lamp toward a mask or work piece.

Linear flash lamps are capable of producing high intensity, high fluence energy output at shorter wavelengths in relatively short pulses of 5 µsec. For example, it has been found that a xenon linear flash lamp, with a broadband spectral output may provide a useful energy density of from 1 $J/cm^2$ to 1.5 $J/cm^2$ during a pulse of 2 µsec to 6 µsec.

The imaging compositions may be removed from substrates in whole or in part by peeling the unwanted portions from the substrates or by using a suitable developer or stripper. The developers and strippers may be aqueous based or organic based. For example, conventional aqueous base solutions, may be used to remove imaging compositions with polymer binders having acidic functionality. Examples of such aqueous base solutions are alkali metal aqueous solutions such as sodium and potassium carbonate solutions. Conventional organic developers used to remove compositions from work pieces include, but are not limited to, primary amines such as benzyl, butyl, and allyl amines, secondary amines such as dimethylamine and tertiary amines such as trimethylamine and triethylamine.

The imaging compositions provide a rapid and efficient means of changing the color or shade of a work piece or of placing an image on a work piece such as aeronautical ships, marine vessels and terrestrial vehicles, or for forming images on textiles. After the imaging composition is applied a sufficient amount of energy is applied to the imaging composition to change its color or shade. Generally, the color or shade change is stable. Stable means that the color or shade change lasts at least 10 seconds, or such as from 20 minutes to 2 days, or such as from 30 minutes to 1 hour.

Alternatively, the energy may be selectively applied to form an imaged pattern, and the work piece may be further processed to form a final article. For example, the image may be used as a mark or indicator to drill holes for fasteners to join parts together such as in the assembly of an automobile, to form an outline for making a logo or picture on an airplane body, or to align segments of marine vessel parts. Since the compositions may be promptly applied to a work piece and the image promptly formed by selective application of energy to create color or shade contrast, workers no longer need to work adjacent the work piece to mark laser beam images with hand-held ink markers or tape in the fabrication of articles. Accordingly, the problems of blocking laser beams caused by workers using the hand-held markers and tape are eliminated.

Further, the reduction of human error increases the accuracy of marking. This is important when the marks are used to direct the alignment of parts such as in aeronautical ships, marine vessels and terrestrial vehicles where accuracy in fabrication is critical to the reliable and safe operation of the machine.

The compositions are suitable for industrial assembly line fabrication of numerous articles. For example, a substrate such as an airplane body may pass to station 1 where the composition is applied to a surface of the airplane body to cover the desired portions or the entire surface. The composition may be coated on the body by standard spray coating or roller coating procedures or brushed on the surface. The coated airplane body is then transferred to station 2 where the energy is applied over the entire surface or is selectively applied to form a pattern. While the first airplane body is at station 2, a second body may be moved into station 1 for coating. The energy may be applied using laser beams, which induce a color or shade change on the surface of the airplane body. Since manual marking by workers is eliminated, the imaged airplane body is then promptly transferred to station 3 for further processing such as developing away or stripping unwanted portions of the coating, or drilling holes in the body for fasteners for the alignment of parts at other stations. Further, the elimination of workers at the imaging station improves the accuracy of image formation since there are no workers to interfere with the laser beams pathway to their designated points on the coated airplane body. Accordingly, the compositions provide for more efficient manufacturing than many conventional imaging and alignment processes. Additionally, since pattern formation may be performed using low intensities of light sources (i.e., 5 mW or less) visual hazards to workers is eliminated or at least reduced.

EXAMPLE 1

Photofugitive Composition and Response

The components disclosed in the table below were mixed together at 20° C. under red light to form a homogeneous mixture.

TABLE 1

| Component | Percent Weight |
|---|---|
| Copolymer of n-hexyl methacrylate, methymethacrylate, n-butyl acrylate, styrene and methacrylic acid | 55 |
| Dipropylene glycol dibenzoate | 16 |
| Hexaarylbiimidazole | 2 |
| 9,10-Phenanthrenequinone | 0.2 |
| Triethanolamine triacetate | 1.5 |
| Leuco Crystal Violet | 0.3 |
| Cyclopentanone, 2,5-bis[[4-(diethylamino)phenyl]methylene]-, (2E, 5E) | 0.1 |
| Methyl ethyl ketone | Sufficient amount to bring formulation to 100% by weight. |

The copolymer was formed from monomers of 29 wt % n-hexyl methacrylate, 29 wt % methylmethacrylate, 15 wt % n-butyl acrylate, 5 wt % styrene, and 22 wt % methacrylic acid. A sufficient amount of methyl ethyl ketone was used to form a 45 wt % solids mixture. The copolymer was formed by conventional free-radical polymerization.

After the homogeneous mixture was prepared, it was spray coated on a polyethylene film. The polyethylene film was 30 cm×30 cm and had a thickness of 250 microns. The homogeneous mixture was dried using a hair dryer to removal the methyl ethyl ketone.

Under UV light the dried coating on the polyethylene film was reddish brown in color as shown in FIG. 1. When the coating was selectively exposed to light at 532 nm from a hand held laser, the exposed portions faded to a light gray as shown by the four rectangular patterns in FIG. 1.

EXAMPLE 2

Pototropic Response and Composition

The components listed in the table below were mixed together at 20° C. under UV light to form a homogeneous mixture.

TABLE 2

| Components | Weight Percent |
|---|---|
| Copolymer of n-hexyl methacrylate, methylmethacrylate, n-butyl acrylate, styrene, and methacrylic acid | 64 |
| Dipropylene glycol dibenzoate | 19 |
| Difluorinated titanocene | 3 |
| Leuco Crystal Violet | 1 |
| Methyl ethyl ketone | A sufficient amount was added to bring the formulation to 100% by weight. |

Figure 2:
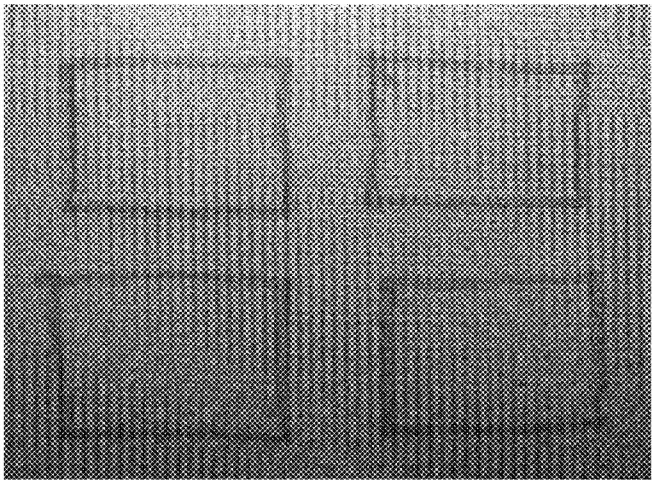
FIG. 2 is a photograph of a phototropic response by an imaging composition dried on a polymer film after selective application of a laser beam.

The same copolymer was used as the one in Example 1. After the mixture was prepared, it was spray coated on a polyethylene film under UV light. The polyethylene film was 30 cm×30 cm and had a thickness of 250 microns. The coating on the polyethylene film was dried using a hair dryer. The coating had a yellow green appearance under UV light as shown in FIG. 2.

Energy from a hand held laser at a wavelength of 532 nm was selectively applied to the coating. The pattern of four rectangles formed with the laser darkened to form four violet rectangles as shown in FIG. 2.

EXAMPLE 3

Photofugitive Response Composition with Adhesion Promoter

The following composition is prepared at 20° C. under red light.

TABLE 3

| Component | Weight Percent |
|---|---|
| Copolymer of n-hexyl methacrylate, methylmethacrylate, n-butyl acrylate, styrene, and methacrylic acid | 80 |
| Pyrenequinone | 1 |
| Triethanolamine Triacetate | 1.3 |
| Leuco Crystal Violet | 0.5 |
| Conjugated Cyclopentanone | 0.2 |
| Hexaarylbiimidazole | 3 |
| Bisacrylamido Acetic Acid | 1 |
| Methyl Ethyl Ketone | Sufficient amount to bring the total weight of the formulation to 100 wt % |

The copolymer is the same copolymer of Example 1. The components are mixed together using a conventional mixing apparatus to form a homogeneous mixture.

The homogeneous mixture is roller coated on a polyethylene terephthalate backed releasable adhesive tape with a cellulose release layer. The bisacrylamide acetic acid adhesion promoter is expected to improve adhesion between the coating and the backing of the releasable adhesive tape.

Selective application of light at 532 nm with a laser beam induces the portions of the coating exposed to the light to change from amber to clear.

EXAMPLE 4

Photofugitive Composition with Adhesive

The following composition is prepared.

TABLE 4

| Components | Weight Percent |
|---|---|
| Copolymer of n-hexyl methacrylate, methylmethacrylate, n-butyl acrylate, styrene, and methacrylic acid | 85 |
| 9,10-Phenanthrenequinone | 0.5 |
| Triethanolamine Triacetate | 1.3 |
| Leuco Crystal Violet | 0.5 |
| Conjugated Cyclopentanone | 0.2 |
| Hexaarylbiimidazole | 2 |
| Silicone Vinyl Copolymer | 10 |
| Methyl Ethyl Ketone | Sufficient amount of methyl ethyl ketone is added to bring the formulation to 100 wt % |

The copolymer is the same copolymer as in Example 1. The components are mixed together at 20° C. using conventional mixing apparatus to form a homogeneous mixture. The mixing is done under red light.

The homogeneous mixture is roller coated on a releasable adhesive tape with a polyethylene terephthalate backing of 40 cm×40 cm with a thickness of 5 mm. Methyl ethyl ketone is driven off using a conventional electric fan at 20° C. Good adhesion is expected between the coating and the polyethylene terephthalate backing.

Selective application of light at 532 nm from a hand held laser causes the selected portions of the coating to go from amber to clear.

EXAMPLE 5

Photosensitive Composition in Paint Formulation

The following paint formulation is prepared.

TABLE 5

| Components | Weight Percent |
|---|---|
| Tamol ™ 731 (25%) dispersant | 1 |
| Propylene Glycol | 2 |
| Patcote ™ 801 (defoamer) | 1 |
| Titanium dioxide-Pure R-900 | 23 |
| Optiwhite ™ (China Clay) | 9 |
| Attagel ™ 50 (Attapulgite Clay) | 1 |
| Acrylic Polymer Binder | 32 |
| Texanol ™ | 1 |
| Thickener water mixture | 21 |
| Water | Sufficient amount to bring the formulation to 100 wt % |

The paint formulation in Table 5 is blended with the photosensitive composition disclosed in Table 4, Example 4 such that the photosensitive composition composes 5 wt % of the final formulation. The paint and the photosensitive composition are mixed together at 20° C. using conventional mixing apparatus to form a homogeneous blend. The mixing is done under red light.

The paint/photosensitive composition blend is roller coated on an aluminum coupon of 80 cm×80 cm with a thickness of 5 mm. Good adhesion is expected between the blend and the aluminum coupon.

Selective application of light at 532 nm from a hand held laser causes the selected portions of the coating to go from amber to clear.

What is claimed is:

1. An imaging composition comprising one or more sensitizers and one or more quinone compounds and one or more acylesters of triethanolamine in sufficient amounts to affect a color or shade change in the imaging composition upon application of energy at powers of 5 mW or less, one or more onium salts, and one or more color formers, the one or more color formers consist of non-deuterated color formers and are selected from aminotriarylmethanes, aminoxanthenes, aminothioxanthenes, amino-9,10-dihydroacridines, aminophenoxazines, aminophenothiazines, aminodihydrophenazines, antinodiphenylmethines, leuco indamines, aminohydrocinnamic acids, hydrazines, leuco indigoid dyes, amino-2,3-dihydroanthraquinones, tetrahalo-p,p'-biphenols, 2(p-hydroxyphenly)-4,5-diphenylimidazoles and phenethylanilines.

2. The imaging composition of claim 1, further comprising one or more oxidizing agents, binder polymers, plasticizers, flow agents, organic acids, adhesion promoters, rheology modifiers, thickeners, surfactants, an adhesive and diluents.

3. The imaging composition of claim 1, wherein the one or more sensitizers has a formula:

(I)

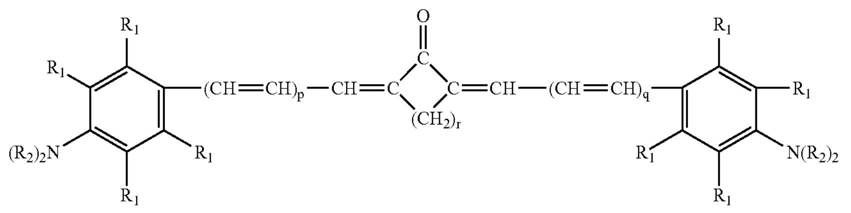

where p and q independently are 0 or 1, r is 2 or 3; and $R_1$ is independently hydrogen, linear or branched ($C_1$-$C_{10}$)aliphatic, or liner or branched ($C_1$-$C_{10}$)alkoxy; and $R_2$ is independently hydrogen, linear or branched ($C_1$-$C_{10}$)aliphatic, ($C_5$-$C_7$)ring, alkaryl, phenyl, linear or branched ($C_1$-$C_{10}$)hydroxyalkyl, linear or branched hydroxy terminated ether, or the carbons of each $R_2$ may be taken together to form a 5 to 7 membered ring with the nitrogen, or a 5 to 7 membered ring with the nitrogen and with a second heteroatom chosen from oxygen, sulfur, or a second nitrogen.

4. The imaging composition of claim 1, further comprising one or more thickeners.

5. The imaging composition of claim 1, wherein the onium salts have iodonium or sulfonium cations.

6. The imaging composition of claim 5, wherein the onium salts are diphenyl lodonium chloride, diphenyliodonium hexafluorophosphate, diphenyl iodonium hexafluoroantimonate, 4,4'dicumyliodonium chloride, dicumyliodonium hexafluorophosphate, 4,4'-bis-dodecylphenyliodoium phosphate and bis-4-dodecylphenyliodonium hexafluoroantimonate.

7. The imaging composition of claim 1, wherein the onium salts are in amounts of 0.01 wt % to 25 wt %.

8. The imaging composition of claim 7, wherein the onium salts are in amounts of 0.5 wt % to 10 wt %.

9. An imaging composition comprising one or more cyclopentanone based conjugated photosensitizers and one or more quinone compounds and one or more acylesters of triethanolamine in sufficient amounts to affect a color or shade change in the imaging composition upon application of energy at powers of 5 mW or less, one or more onium salts, and one or more color formers, the one or more color formers consist of non-deuterated color formers and are selected from aminotriarylmethanes, aminoxanthenes, aminothioxanthenes, amino-9,10-dihydroacridines, aminophenoxazines, aminophenothiazines, aminodihydrophenazines, antinodiphenylmethines, leuco indamines, aminohydrocinnamic acids, hydrazines, leuco indigoid dyes, amino-2,3-dihydroanthraquinones, tetrahalo-p,p'-biphenols, 2(p-hydroxyphenyls)-4,5-diphenylimidazoles and phenethylanilines.

10. The imaging composition of claim 9, further comprising one or more reducing agents, oxidizing agents, binder polymers, plasticizers, flow agents, organic acids, surfactants, diluents, rheology modifiers, thickeners, adhesion promoters, and an adhesive.

11. The imaging composition of claim 10, wherein the one or more cyclopentanone based conjugated photosensitizers comprise from 0.005 wt % to 10 wt % of the composition.

12. An imaging composition comprising one or more sensitizers, one or more quinone compounds and one or more acylesters of triethanolamine, one or more diluents, one or more rheology modifiers, one or more onium salts having iodonium or sulfonium cations, one or more thickeners, and one or more color formers, the one or more color formers consist of non-deuterated color formers and are selected from aminotriarylmethanes, aminoxanthenes, aminothioxanthenes, amino-9,10-dihydroacridines, aminophenoxazines, aminophenothiazines, aminodihydrophenazines, antinodiphenylmethines, leuco indamines, aminohydrocinnamic acids, hydrazines, leuco indigoid dyes, amino-2,3-dihydroanthraquinones, tetrahalo-p,p'-biphenols, 2(p-hydroxyphenyl)-4,5-diphenylimidazoles and phenethylanilines, the one or more sensitizers are in sufficient amounts to provide a color or shade change in the imaging composition upon application of energy at powers of 5 mW or less.

13. A method comprising:

a) providing an imaging composition comprising one or more sensitizers and one or more quinone compounds and one or more acylesters of triethanolamine in sufficient amounts to affect a color or shade change in the imaging composition upon exposure to energy at powers of 5 mW or less, one or more onium salts, and one or more color formers, the one or more color formers consist of non-deuterated color formers and are selected from aminotriarylmethanes, aminoxanthenes, aminothioxanthenes, amino-9,10-dihydroacridines, aminophenoxazines, aminophenothiazines, aminodihydrophenazines, antinodiphenylniethines, leuco indamines, aminohydrocinnamic acids, hydrazines, leuco indigoid dyes, amino-2,3-dihydroanthraquinones, tetrahalo-p,p'-biphenols, 2(p-hydroxyphenyl)4,5-diphenylimidazoles and phenethylanilines;

b) applying the composition to a workpiece; and c) applying the energy at the intensity of 5 mW or less to the imaging composition to affect the color or shade change.

14. The method of claim 13, wherein the energy applied is at least 0.2 mJ/cm2.

15. The method of claim 13, wherein the energy is selectively applied to the imaging composition to form a pattern.

16. The method of claim 13, wherein the imaging composition further comprises one or more thickeners.

* * * * *